(12) United States Patent
Hsueh et al.

(10) Patent No.: US 10,670,976 B2
(45) Date of Patent: Jun. 2, 2020

(54) EUV RETICLE POD

(71) Applicant: Gudeng Precision Industrial Co., LTD, New Taipei (TW)

(72) Inventors: Hsin-Min Hsueh, New Taipei (TW); Chia-Ho Chuang, New Taipei (TW); Cheng-Ju Lee, New Taipei (TW); Jeng-Jie Huang, New Taipei (TW)

(73) Assignee: GUDENG PRECISION INDUSTRIAL CO., LTD, New Taipei (TW)

( * ) Notice: Subject to any disclaimer, the term of this patent is extended or adjusted under 35 U.S.C. 154(b) by 32 days.

(21) Appl. No.: 15/880,243

(22) Filed: Jan. 25, 2018

(65) Prior Publication Data
US 2018/0210349 A1 Jul. 26, 2018

Related U.S. Application Data

(60) Provisional application No. 62/450,172, filed on Jan. 25, 2017.

(51) Int. Cl.
| G03F 1/66 | (2012.01) |
| G03F 7/20 | (2006.01) |
| H01L 21/673 | (2006.01) |

(52) U.S. Cl.
CPC ........... *G03F 7/70741* (2013.01); *G03F 1/66* (2013.01); *H01L 21/67353* (2013.01); *H01L 21/67359* (2013.01)

(58) Field of Classification Search
CPC ........ H01L 21/67359; H01L 21/67353; B65D 25/10; G03F 1/66; G03F 7/70741; G03F 7/70733

USPC .................. 206/710, 454, 711, 722, 723
See application file for complete search history.

(56) References Cited

U.S. PATENT DOCUMENTS

| 6,187,182 | B1 | 2/2001 | Reynolds et al. | |
| 7,209,220 | B2 * | 4/2007 | Puerto | B82Y 10/00 355/72 |
| 7,400,383 | B2 * | 7/2008 | Halbmaier | H01L 21/67389 206/449 |
| 7,607,543 | B2 * | 10/2009 | Gregerson | G03F 1/66 206/710 |

(Continued)

FOREIGN PATENT DOCUMENTS

TW     201420462 A     6/2014

*Primary Examiner* — Steven A. Reynolds
(74) *Attorney, Agent, or Firm* — WPAT, PC

(57) ABSTRACT

An EUV reticle pod is provided. The pod includes an inner and an outer box assembly. The inner box assembly contained in the outer box assembly includes a base and a cover. The base has an upper surface and a surrounding wall. The upper surface includes a carry surface, at least one trench, and a first contacting surface. The EUV reticle is carried above the carry surface. The trench has a circular loop structure and its bottom is lower than the carry surface. The carry surface, the trench, and the first contacting surface are sequentially distributed from the center of the upper surface towards the surrounding wall. The cover has a concave for accommodating the EUV reticle and a second contacting surface for cooperating with the first contacting surface to form an air-tight seal. The trench captures and traps particles to reduce the particle contamination on the reticle.

9 Claims, 9 Drawing Sheets

(56) References Cited

U.S. PATENT DOCUMENTS

| | | | | |
|---|---|---|---|---|
| 8,220,630 B1* | 7/2012 | Ku | ............... | G03F 7/70741 |
| | | | | 206/454 |
| 8,870,014 B2* | 10/2014 | Lin | ............... | B65D 43/08 |
| | | | | 206/454 |
| 9,022,216 B2* | 5/2015 | Ku | ............... | B65D 85/48 |
| | | | | 206/454 |
| 9,745,119 B2* | 8/2017 | Kolbow | ............... | G03F 1/66 |
| 9,958,772 B1* | 5/2018 | Hsueh | ............... | B65D 25/10 |
| 2006/0000747 A1* | 1/2006 | Wright | ............... | H01L 21/67353 |
| | | | | 206/710 |
| 2010/0294397 A1* | 11/2010 | Kishkovich | ............... | G03F 1/66 |
| | | | | 141/66 |
| 2013/0020220 A1* | 1/2013 | Kolbow | ............... | G03F 1/66 |
| | | | | 206/454 |
| 2017/0294326 A1* | 10/2017 | Raschke | ............... | H01L 21/67011 |
| 2019/0214287 A1* | 7/2019 | Chiu | ............... | H01L 21/67353 |

\* cited by examiner

EUV RETICLE POD

RELATED APPLICATIONS

This application claims priority to U.S. Provisional Patent Application No. 62/450,172, by Hsueh, et al., titled "Reticle Pod," filed Jan. 25, 2017 which is hereby incorporated by reference herein in their entirely.

BACKGROUND OF THE INVENTION

Technical Field

The present invention relates to a reticle pod. More particularly, the present invention relates to a dual containment EUV reticle pod.

Description of Related Art

In recent years, the semiconductor manufacturing technology advances rapidly, in which the photolithography process plays an important role. Generally, photolithography involves fabricating a light permeable reticle with desired pattern and projecting the pattern onto a wafer having photoresist by exposing to a light source. After etching and other process steps, the desired pattern is formed on the wafer.

During the photolithography process, any particles attached on the wafer, such as dust or organic matters, would deteriorate the image quality projected onto the wafer. However, the industry trend is towards the production of chips that are smaller in size and with a higher logic density. The wavelength of the light source used by the photolithography equipment is narrowed down to the range of extreme ultraviolet light (EUV). As a result, the manufacturers must set a stricter standard for particle number, particle size, and the internal cleanliness of the reticle pod.

Generally, the reticle pods used in the semiconductor process are made of anti-contaminate material to keep the reticle clean. The reticle pods or semiconductor component containers also should comply with the miniature cleanroom requirements of Standard Mechanical Interface (SMIF) technology. However, even in a controlled environment, the reticle pods are still subjected to particle contamination resulting from the fluctuation of air pressure or the air disturbance by the movement of the container. The particles can be carried into the region between the reticle and the container and even onto the reticle, so the reticle pods still couldn't provide sufficient protection to the reticle from particle contamination.

SUMMARY

In view of the above-mentioned problems, the present invention is to provide an EUV reticle pod. One or more circular-loop-structured trenches are provided on the base of the EUV reticle pod to trap or capture particles to reduce migration of particles into the region between the carrying surface and the EUV reticle or onto the EUV reticle, and thus the particle contamination can be mitigated.

According to one aspect of the invention, the EUV reticle pod includes an outer box assembly and an inner box assembly. The outer box assembly includes an upper portion and a lower portion that cooperate with each other and define a containing space for the inner box assembly. The inner box assembly includes a base and a surrounding wall. Several positioning members are disposed on and protruded from the upper surface to define a receiving space for the EUV reticle. The surrounding wall surrounds and connects the upper surface. The upper surface includes a carrying surface, at least one trench, and a first contacting surface. When the EUV reticle is received in the receiving space, the EUV reticle is carried above the carrying surface. The trench has a circular loop structure, and a bottom of the trench is lower than the carrying surface. The carrying surface, the trench, and the first contacting surface are sequentially distributed from a center of the upper surface towards the surrounding wall. The cover for mating with the base has a concave for accommodating the EUV reticle and a second contacting surface for cooperating with the first contacting surface to form an air-tight seal.

In one embodiment of the invention, the trench continuously and completely surrounds the carrying surface, and the first contacting surface continuously and completely surrounds the trench.

In another embodiment of the invention, the upper surface includes more than one trenches which individually has the circular loop structure, and the trenches are situated between the carrying surface and the first contacting surface, and each trench individually surrounds the positioning members.

In yet another embodiment of the invention, the first contacting surface is lower than the carrying surface, and the bottom of the trench is lower than the first contacting surface.

In still another embodiment of the invention, the upper surface further includes more than one basin communicating with the trench, and a bottom of the basin is lower than the bottom of the trench.

In yet another embodiment of the invention, a width of the basin is larger than a width of the trench in a direction parallel to the carrying surface.

In still another embodiment of the invention, the cover includes an indented surface between the concave and the second contacting surface, and the indented surface and the second contacting surface are situated on different horizontal levels, so that a gap is kept between the indented surface and the upper surface of the base.

In yet another embodiment of the invention, the cover includes more than one elastic members that correspond to the locations of the positioning members, and the elastic members are configured to contact and press the EUV reticle when the cover is engaged with the base and the inner box assembly is contained in the outer box assembly.

In still another embodiment of the invention, the cover includes more than one guiding members that are configured to extend towards the base and to elastically contact the surrounding wall of the base when the cover is engaged with the base.

In yet another embodiment of the invention, the base includes a block member disposed in the trench, and a top end of the block member is brought into firm contact with the second contacting surface when the cover is engaged with the base.

According to the disclosure of the embodiments of the invention, one or more circular-loop-structured trench is provided between the carrying surface and the first contacting surface of the upper surface to trap or captured particles. The contamination of particles migrating into the region between the carrying surface and the reticle, and even onto the reticle, can be mitigated.

BRIEF DESCRIPTION OF DRAWINGS

The invention can be more fully understood by reading the following detailed description of the embodiment, with reference made to the accompanying drawings as follows.

DETAILED DESCRIPTION

Figure 1:
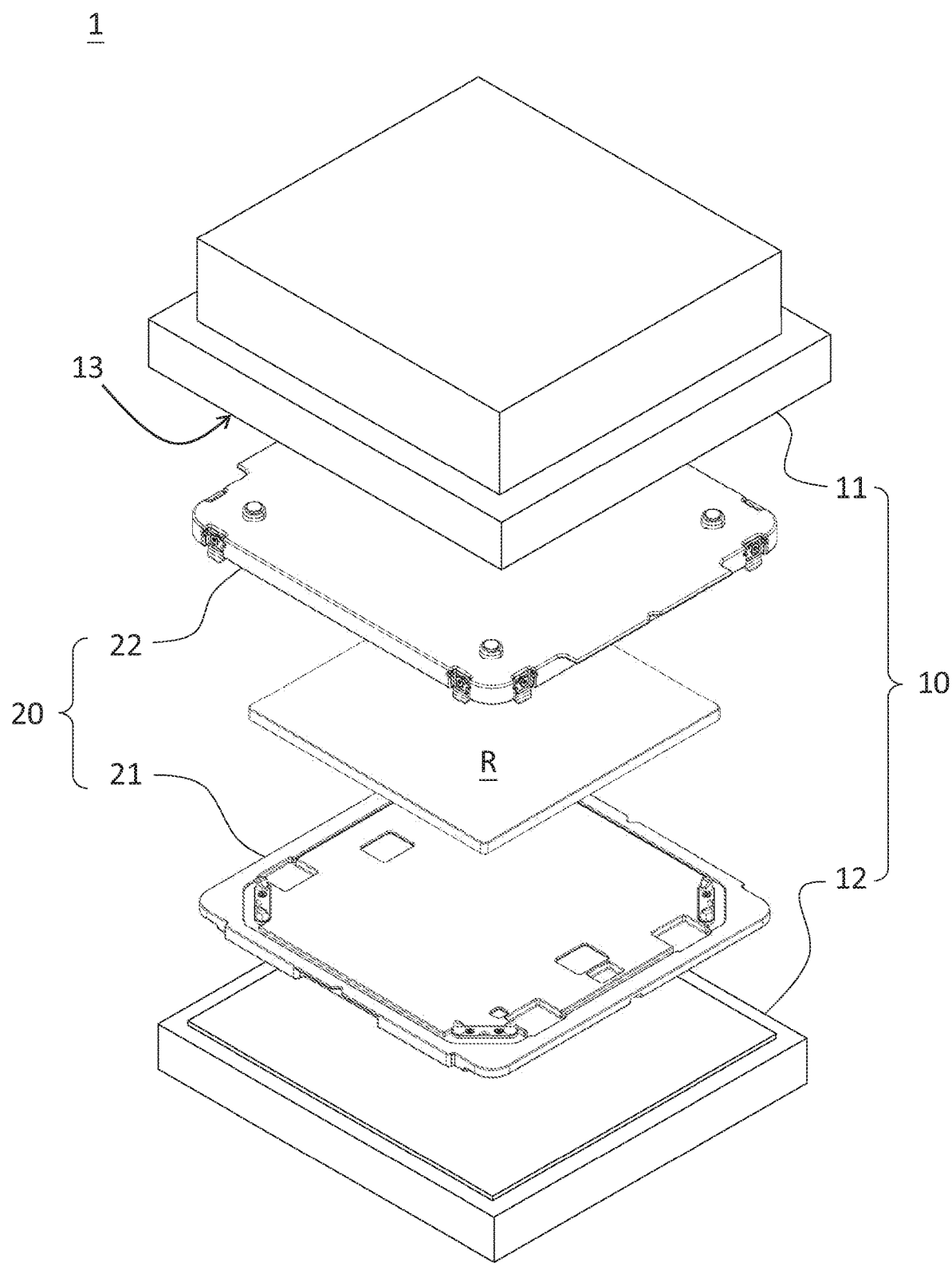
FIG. 1 is an exploded view of an EUV reticle pod according to one embodiment of the invention.

The EUV reticle pod includes a base and a cover. At least one trench with circular loop structure is provide on the base to trap or capture particles. Therefore, the risk of particles migrating into the region between the carrying surface and the EUV reticle is mitigated. Reference will now be made in detail to elaborate the contents and the features of the embodiments of the present invention, examples of which are illustrated in the accompanying drawings. For clearly showing the features of the present invention, elements are simplified or omitted in the drawings, and the relative proportions of components are for exemplary purpose only.

Please refer to FIG. 1, which is an exploded view of an EUV reticle pod according to one embodiment of the invention. The EUV reticle pod 1 is used for containing an EUV reticle R. The EUV reticle pod 1 includes an outer box assembly 10 and an inner box assembly 20. The outer box assembly 10 includes an upper portion 11 and a lower portion 12 that cooperate with each other and define a containing space 13 for containing the inner box assembly 20.

In the present embodiment, each of the upper portion 11 and the lower portion 12 of the outer box assembly 10 is in a rectangular shape. When the upper portion 11 and the lower portion 12 are engaged with each other, an air-tight status is formed to separate the containing space 13 from the outside of the outer box assembly 10. The upper portion 11 and the lower portion 12 can be exemplified by having one or more air valves (not shown in the drawings) with filter material such as filter paper disposed at the air valves. The air can be kept clean while entering or leaving the containing space 13 through the air valves. The upper portion 11 can further be exemplified by having several guiding elements (not shown in the drawings). When the upper portion 11 and the lower portion 12 are mating with each other, the guiding elements are used to adjust and correct the relative positions of the two portions 11 and 12 or the position of the inner box assembly 20. The lower portion 12 can further be exemplified by having several supporting elements (not shown in the drawings) for supporting the inner box assembly 20. The above-mentioned elements, their structure, and their disposition can be determined by actual product needs, and will be not limited in the present invention.

Figure 2:
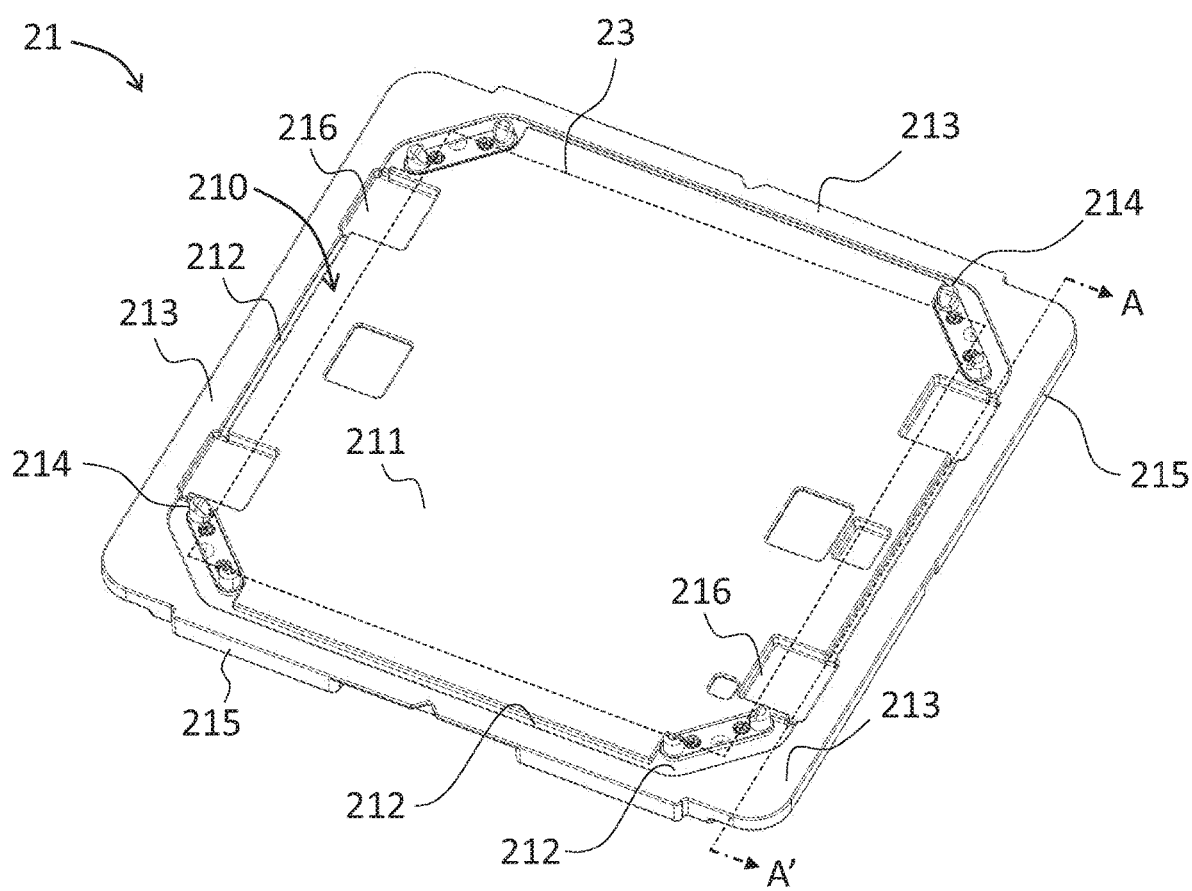
FIG. 2 is a perspective view of the base in FIG. 1.

Please refer to FIG. 1 and FIG. 2 at the same time. FIG. 2 is a perspective view of the base in FIG. 1. The inner box assembly 20 of the present embodiment includes a base 21 and a cover 22. The base 21 is provided with an upper surface 210 and a surrounding wall 215. The upper surface 210 is a surface of the base 21 that faces the cover 22, and several positioning members 214 are disposed on and protruded from the upper surface 210. The surrounding wall 215 is the lateral side wall of the base 21 and it connects and surrounds the upper surface 210.

The positioning members 214 and the base 21 are made of different materials. Exemplary, when the base 21 is made of a metallic material, the positioning members 214 are made of a low-particle-generating material such as abrasion resist plastic. The positioning members 214 can be fixed onto the base 21 by screws for example, and protruded from the upper surface 210. The positioning members 214 can be distributed in a way corresponding to the four corners of the rectangular EUV reticle R. Each positioning member 214 has an inclined guiding surface for guiding and adjusting the position of the EUV reticle R. Through the configuration of the positioning members 214, a receiving space 23 for the EUV reticle R can be defined on the base 21. The structure, the amount, the fixing mechanism, and the disposition of the positioning members 214 are not limited to the embodiment shown in FIG. 2. Any other forms of elements that can define the receiving space 23 on the base 21 can be used here as the positioning members 214.

The upper surface 210 of the base 21 includes a carrying surface 211, a trench 212, and a first contacting surface 213. According to the embodiment of the invention, the carrying surface 211, the trench 212, and the first contacting surface 213 are sequentially distributed from a center of the upper surface 210 towards the surrounding wall 215. That is, the carrying surface 211 is in the proximity center of the upper surface 210, the first contacting surface 213 is in the outer region of the upper surface 210, and the trench 212 situates intermediate therebetween. The EUV reticle R is carried above the carrying surface 211 when it is received in the receiving space 23. The trench 212 has a circular loop structure and a bottom of the trench 212 is lower than the carrying surface 211. In the present embodiment, the carrying surface 211 is a flat, generally planar surface. The trench 212 continuously and completely surrounds the carrying surface 211, and the first contacting surface 213 continuously and completely surrounds the trench 212. Therefore, one full circular trench 212 is provided on the base 21 in the present embodiment of the invention, as shown in FIG. 2.

Figure 3:
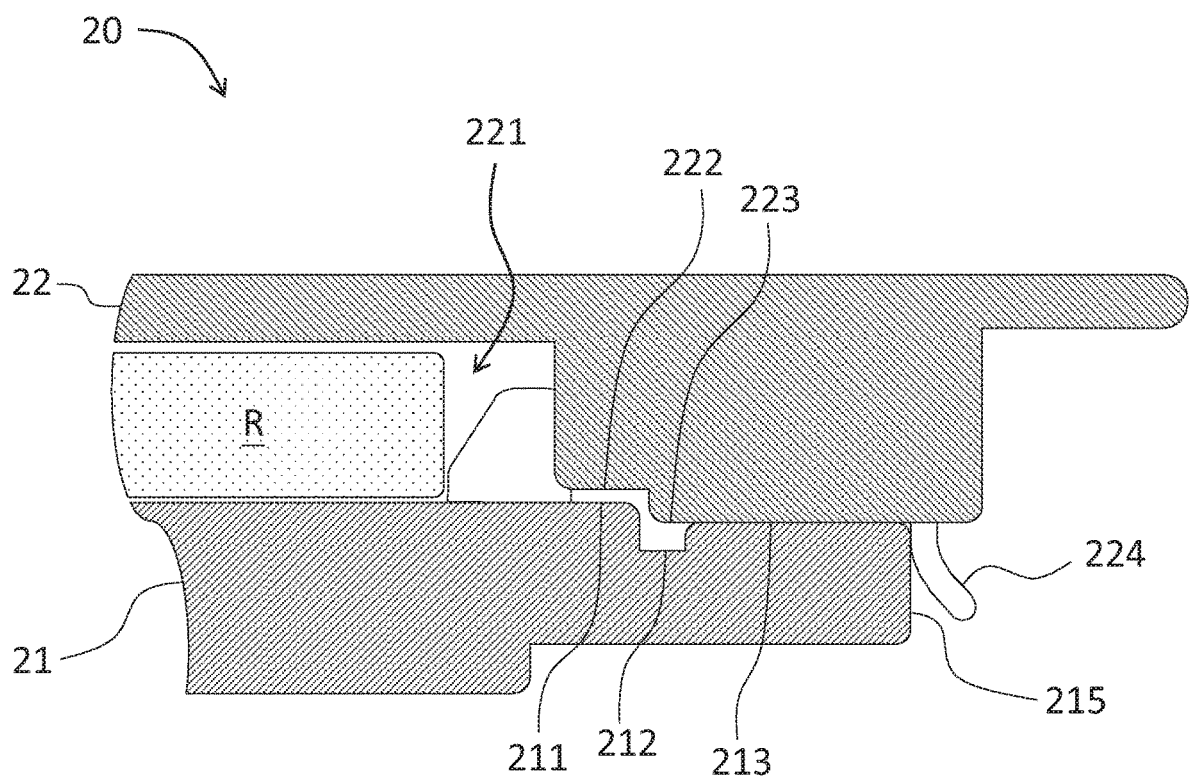
FIG. 3 is a partial cross-sectional view of the inner box assembly and the EUV reticle in FIG. 1.

Please refer to FIG. 2 and FIG. 3 at the same time. FIG. 3 is a partial cross-sectional view of the inner box assembly and the EUV reticle in FIG. 1. Only a part of the inner box assembly 20 and received EUV reticle R is shown in FIG. 3. The left side in FIG. 3 is close to the center of the carrying surface 211, and the right side in FIG. 3 shows the edge of inner box assembly 20 (that is where the surrounding wall 215 located). The carrying surface 211, the trench 212, and the first contacting surface 213 are sequentially distributed from the center of the upper surface 210 towards the surrounding wall 215 (from left to right in FIG. 3). The first contacting surface 213 is lower than the carrying surface 211, and the bottom of the trench 212 is lower than the first contacting surface 213. The trench 212 is a recess structure and has a bottom at the lowest location. Measuring from the bottom of the trench 212, the side wall that connects to the carrying surface 211 is taller than the side wall that connects to the first contacting surface 213. Each side wall connects to the bottom of the trench 212 with a sharp corner; or at least with a very small, insignificant curved corner.

The trench 212 is used for trap or capture particles. When the particles in the trench 212 are raised by the air flow, they will be blocked by the side wall that connects to the carrying surface 211. The chances of the particles migrating into the region between the EUV reticle R and the carrying surface 211 or even attaching onto the EUV reticle R can be lowered, thus reducing the contamination on the carrying surface 211. The trench 212 has another beneficial aspect. Practically, the air-tight seal between the first contacting surfaces 213 and the second contacting surface 223 may not achieve the desired level due to process problems (such as surface treatment errors). When the desired air-tightness between the two contacting surfaces 213 and 223 is not attained, a small air flow channel is formed therebetween to lead the particles towards the trench 212. Since the two side walls of the trench 212 having different heights, the particles are trapped and retained in the trench 212 and prevented from migrating into the region between the carrying surface 211 and the EUV reticle R.

Figure 4:
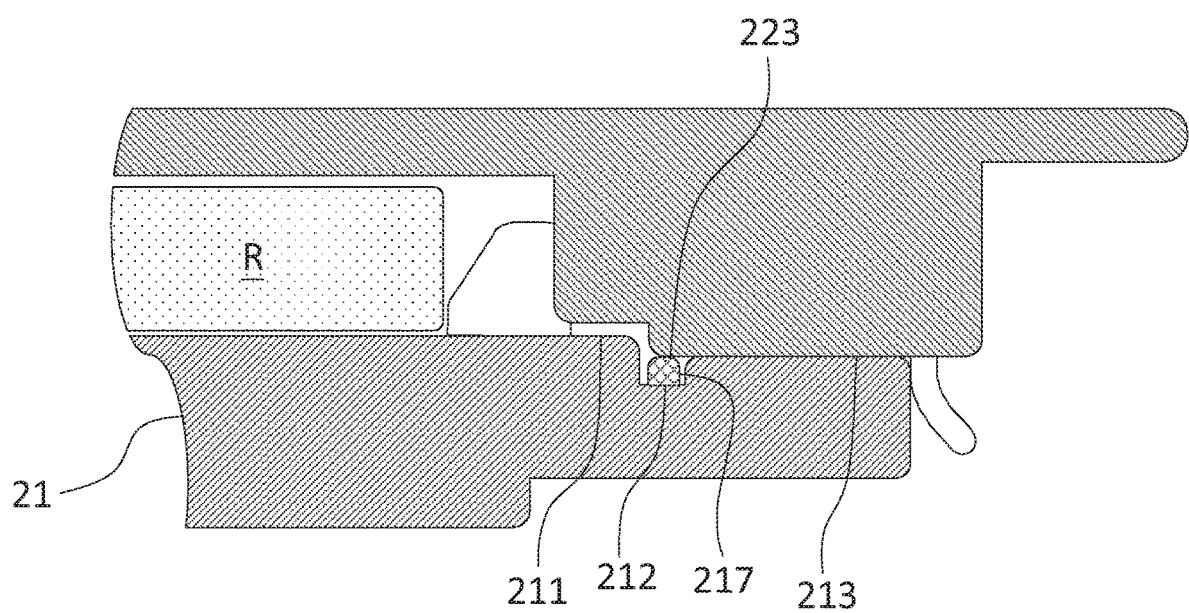
FIG. 4 is the same cross-sectional view as FIG. 3 with a block member on the base.

Please refer to FIG. 4, which is the same cross-sectional view as FIG. 3 with a block member on the base. In this embodiment, the base 21 includes a block member 217 disposed in the trench 212; to be more specific, on the bottom of the trench 212. The height of the block member 217 from its bottom to a top end thereof is at least slightly taller than the side wall of the trench 212 that connects to the first contacting surface 213. When the cover 22 is engaged with the base 21, the top end of the block member 217 is brought into firm contact with the second contacting surface 223. As a result, the particles can be prevented from migrating into the region between the carrying surface 211 and the EUV reticle R. In one embodiment, the block member 217 has a circular loop structure to be continuously fitted in the trench 212.

Figure 5:
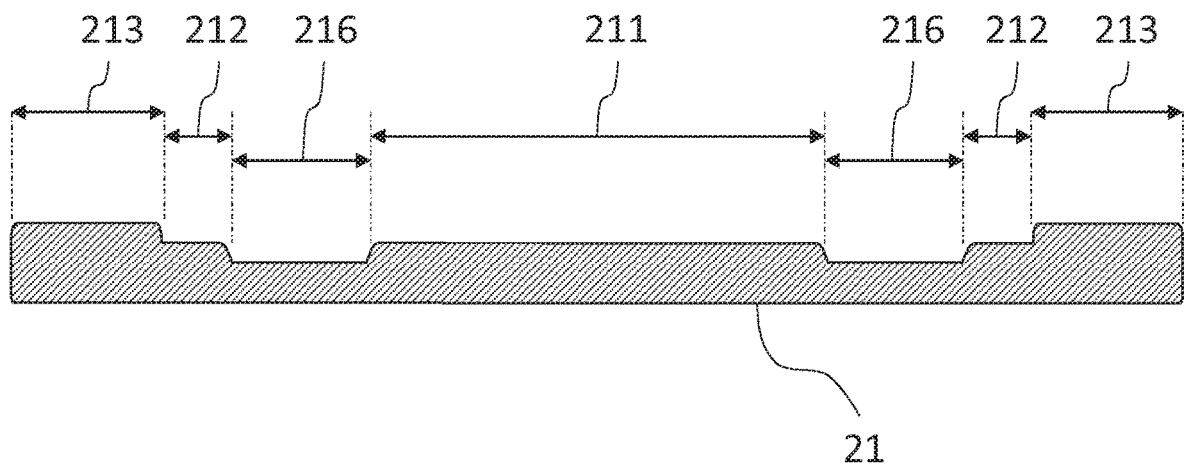
FIG. 5 is a cross-sectional view of the base in FIG. 2.

Please refer to FIG. 2 and FIG. 5 at the same time. FIG. 5 is a cross-sectional view of the base in FIG. 2. The cross-sectional view of the base 21 in FIG. 2 is taken along line A-A' shown in FIG. 2. In the present embodiment, the upper surface 210 of the base 21 further includes at least one basin 216 that communicates with the trench 212. A bottom of the basin 216 is lower than the bottom of the trench 212, and in a direction parallel to the carrying surface 211, a width of the basin 216 is larger than a width of the trench 212. The basin 216 is a further recess structure having larger area to trap or capture particles. Therefore, in addition to the trench 212, the particles can be retained in the basin 216 as well.

Figure 6:
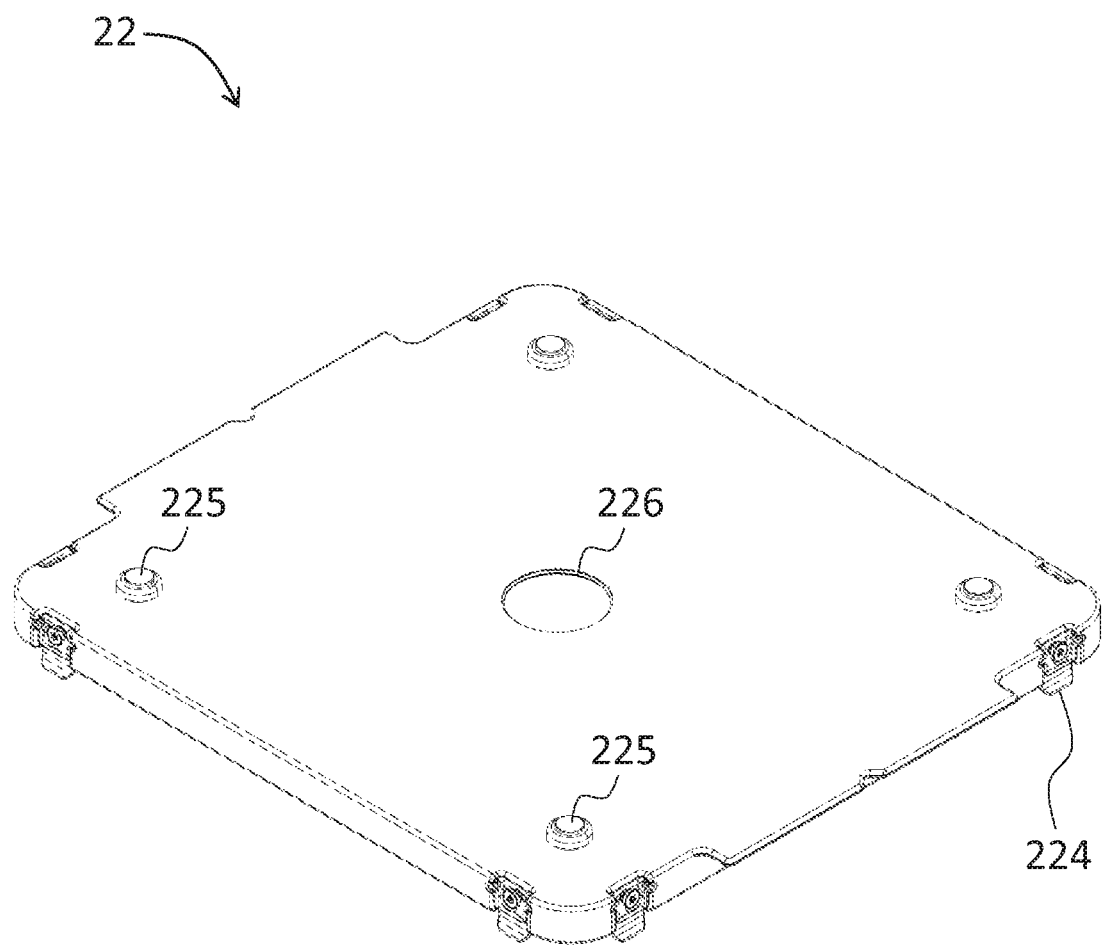
FIG. 6 is a perspective view of the cover in FIG. 1.
Figure 7:
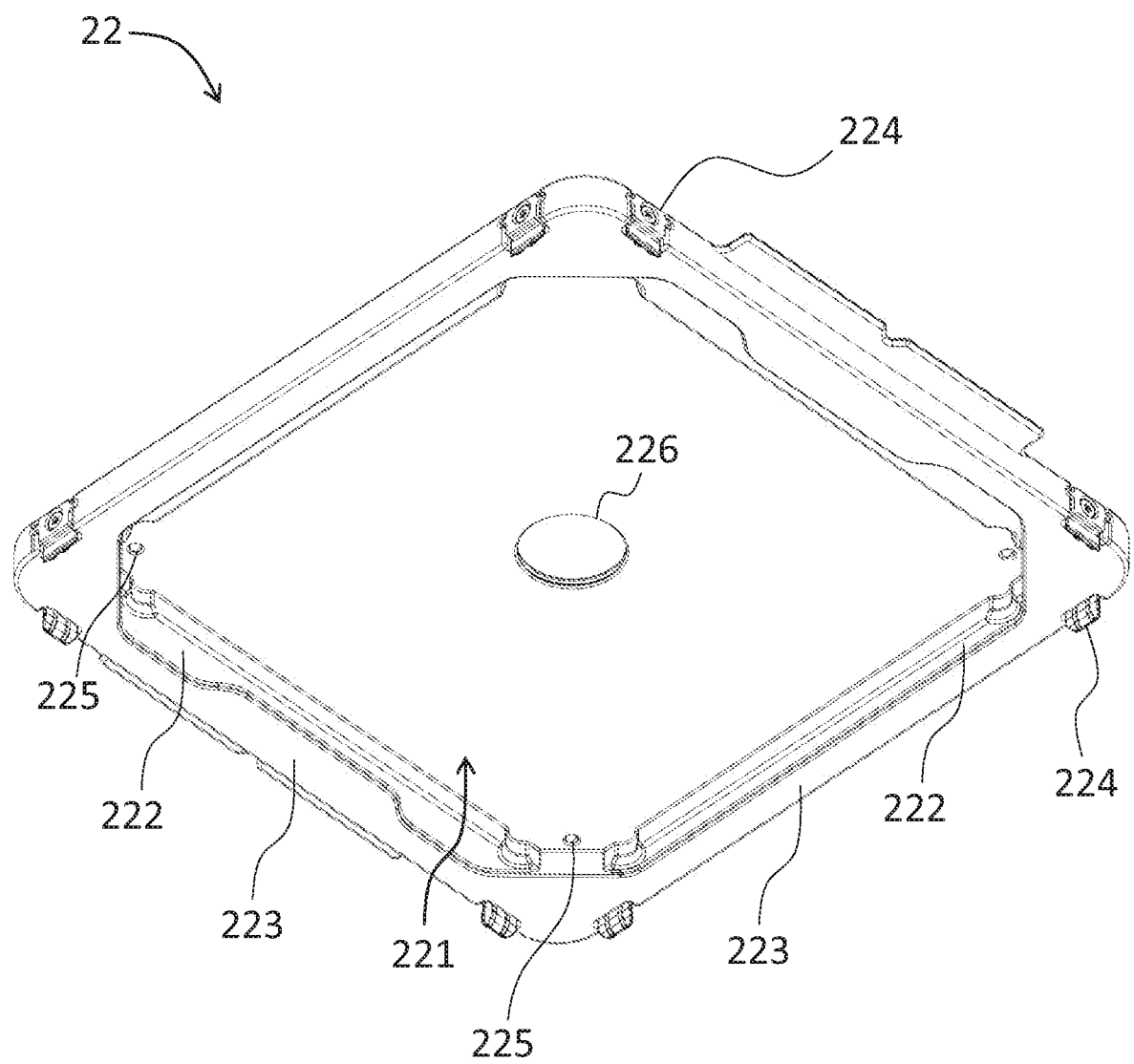
FIG. 7 is another perspective view of the cover in FIG. 1.

The cover 22 of the inner box assembly 20 will be elaborated in more detail with referring to FIG. 6 and FIG. 7 at the same time. FIG. 6 is a perspective view of the cover in FIG. 1, and FIG. 7 is another perspective view of the cover in FIG. 1. The cover 22 is used for mating with the base 21 and has a concave 221 and a second contacting surface 223. The concave 221 is used for accommodating the EUV reticle R and the second contacting surface 223 is used for cooperating with the first contacting surface 213 to form an air-tight seal, as shown in FIG. 3. In the present embodiment, the first and the second contacting surface 213 and 223 are flat surfaces or planar surfaces with relative small roughness that cooperate with each other to provide sealing when they are brought into contact.

In the present embodiment, the cover 22 includes an indented surface 222 between the concave 221 and the second contacting surface 223. The indented surface 222 locates on a different horizontal level from that of the second contacting surface 223 such that a gap is kept between the indented surface 222 and the upper surface 210 of the base 21. To be more specific, the two horizontal levels on which the indented surface 222 and the second contacting surface 223 respectively situated are two parallel horizontal levels. As shown in FIG. 3, the gap is between the indented surface 222 and the carrying surface 211 of the upper surface 210, and the trench 212 is partially covered by the second contacting surface 223. When the cover 22 is engaged with the base 21, the deposited particles or particles raised by air flow can migrate into the trench 212 and the basin 216 to be trapped or captured therein.

Please refer to FIG. 6 and FIG. 7. The cover 22 of the present embodiment includes several guiding members 224. The guiding members 224 are configured in a way that they extend towards the base 21 when the cover 22 is engaged with the base 21. The guiding members 224 extending towards the base 21 are used for elastically contacting the surrounding wall 215 of the base 21, as shown in FIG. 3. While the cover 22 is mating with the base 21, the guiding members 224 are used to adjust and correct the relative positions of the cover 22 and the base 21, so the two can be engaged correctly. In the present embodiment, the guiding members 224 can be configured in a way corresponding to the four corners of the cover 22. The amount and the disposition of the guiding members 224 are not limited to the embodiment shown in FIG. 6 and FIG. 7. Any other forms of elements, which extend toward the base 21 and elastically contact the surrounding wall 215 when the cover 22 and the base 21 are engaged with each other, can be used here as the guiding members 224.

The cover 22 of the present embodiment includes several elastic members 225 that correspond to the locations of the positioning members 214. The elastic members 225 are configured to contact and press the EUV reticle R when the cover 22 is engaged with the base 21 and the inner box assembly 20 is contained in the outer box assembly 10. The elastic members 225 restrain the movement of the EUV reticle R in the vertical direction, thereby preventing the EUV reticle R from moving and thus inhibiting the particles from generating. Practically, several protruded elements (not shown in the drawings) can be disposed on the inner surface of the upper portion 11 of the outer box assembly 10 and they can be in relation to the locations of the elastic members 225. When the inner box assembly 20 is contained in the containing space 13 of the outer box assembly 10, the protruded elements press one end of the elastic members 225 respectively. The other end of the elastic members 255 are brought into contact and press the EUV reticle R consequently. The structure and the configuration of the protruded elements are not limited in the present invention.

In the present embodiment, the cover 22 includes at least one air inlet 226 and a filtration material disposed at the air inlet 226. The air inlet 226 provides a window for the air to entering the concave 221. When air is purged into the concave 221 through the air inlet 226, the particles in the concave 221, now carried by the air flow, migrate towards the trench 212 outside the carrying surface 221, so that the particles can be trapped or captured in the trench 212 or the basin 216.

Figure 8:
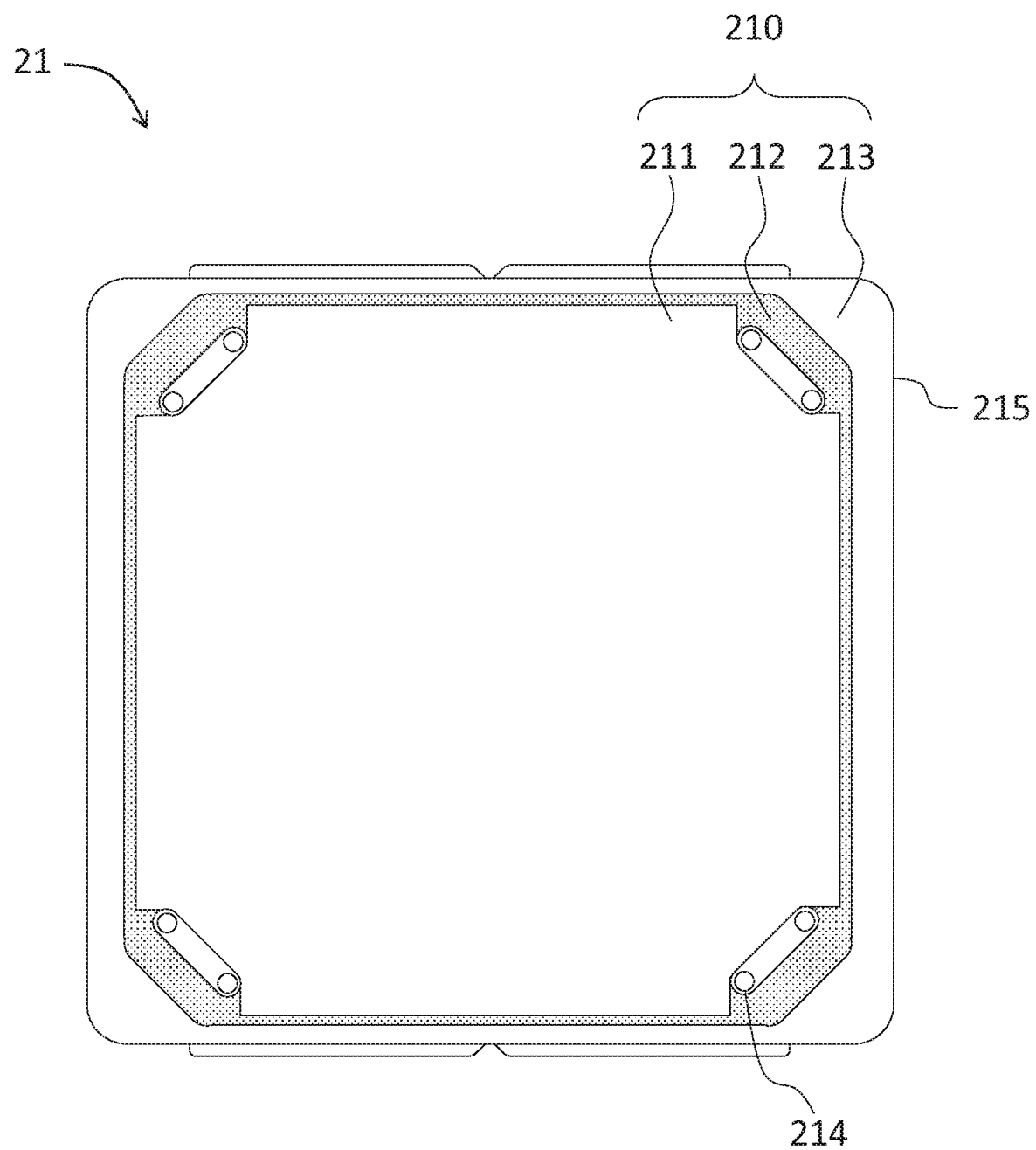
FIG. 8 is a perspective view of the carrying surface, the trench, and the first contacting surface in FIGS. 1-3.

Please refer to FIG. 8, which is a perspective view of the carrying surface, the trench, and the first contacting surface in FIGS. 1-3. According to the embodiment of EUV reticle pod 1, the carrying surface 211, the trench 212, and the first contacting surface 213 of the upper surface 210 are distributed sequentially from the center of the upper surface 210 toward the surrounding to wall 215. The trench 212 completely and continuously surrounds the carrying surface 211, and the first contacting surface 213 completely and continuously surrounds the trench 212, and hence one full circular trench 212 is provided on the base 21. However, the present invention is not limited hereto.

Figure 9:
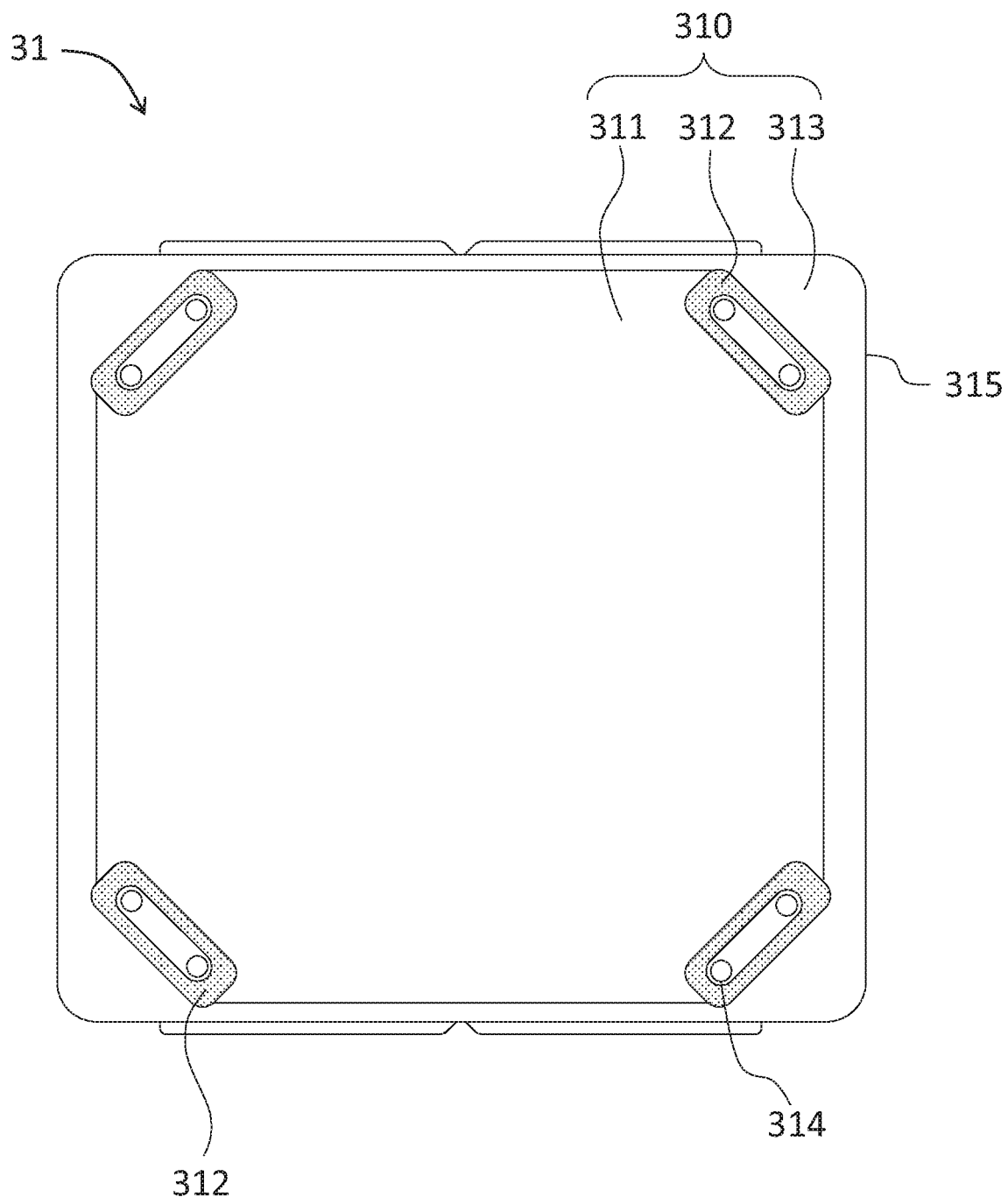
FIG. 9 is a perspective view of the carrying surface, the trench, and the first contacting surface according to another embodiment of the invention.

Please refer to FIG. 9, which is a perspective view of the carrying surface, the trench, and the first contacting surface according to another embodiment of the invention. Of a base 31 of an EUV reticle pod shown in FIG. 9, a carrying surface 311, several trenches 312, and a first contacting surface 313 of an upper surface 310 are distributed from a center of the carrying surface 311 towards a surrounding wall 314. The trenches 312 are provided on the upper surface 310, each having a circular loop structure. The trenches 312 situate between the carrying surface 311 and the first contacting surface 313, and respectively surround positioning members 314. A bottom of each trench 312 is lower than the first contacting surface 313 and the carrying surface 311, and thus each trench 312 has a recess structure. Each circular loop trench 312 that surrounds the positioning members 314 can be used to capture or trap particles generated at the location. The particles in the trench 312, when being raised by the air flow, can be block by the side walls of the trench 312. The migration of particles onto the carrying surface 311 is mitigated, and thus particle contamination on the EUV reticle R can be reduced.

According to the above-mentioned embodiments of the invention, an EUV reticle pod includes an outer box assembly and an inner box assembly. The outer box assembly includes an upper portion and a lower portion that cooperate with each other and define a containing space for the inner box assembly. The inner box assembly includes a base and a cover. The base has an upper surface and surrounding wall. Several positioning members are disposed on and protruded from the upper surface to define a receiving space for an EUV reticle. The surrounding wall connects and surrounds the upper surface. The upper surface includes a carrying surface, at least one trench, and a first contacting surface. The EUV reticle is carried above the carrying surface when it is received in the receiving space. The trench has a circular loop structure and a bottom of the trench is lower than the carrying surface. The carrying surface, the trench, and the first contacting surface are sequentially distributed from a center of the upper surface towards the surrounding wall. The cover is used for mating with the base and has a concave for the EUV reticle and a second contacting surface for cooperating with the first contacting surface to form an air-tight seal. By trapping or capturing the particles in the circular-loop-structured trench, the problems of particle contamination can be mitigated.

The ordinal numbers used in the detailed description and claims, such as "first" and "second" do not necessarily indicate their priority orders or up and down directions; on the contrary, they are merely intended to distinguish different elements. It will be apparent to those skilled in the art that various modifications and variations can be made to the structure of the present invention without departing from the scope or spirit of the invention. In view of the foregoing, it is intended that the present invention covers modifications and variations of this invention, provided they fall within the scope of the following claims.

What is claimed is:

1. A EUV reticle pod comprising an outer box assembly and an inner box assembly, wherein the outer box assembly comprising an upper portion and a lower portion cooperating with each other and defining a containing space for the inner box assembly, and the inner box assembly comprising:
    a base having an upper surface and a surrounding wall, a plurality of positioning members being disposed on and protruded from the upper surface to define a receiving space for an EUV reticle, the surrounding wall surrounding and connecting to the upper surface, and the upper surface comprising:
        a carrying surface above which the EUV reticle is carried when the EUV reticle is received in the receiving space;
        at least one trench having a circular loop structure and a bottom of the trench is lower than the carrying surface for trapping or capturing particles; and
        a first contacting surface, wherein the carrying surface, the trench, and the first contacting surface are sequentially distributed from a center of the upper surface towards the surrounding wall, and the first contacting surface is lower than the carrying surface, and the bottom of the trench is lower than the first contacting surface; and
    a cover for engaging with the base and having a concave for accommodating the EUV reticle and a second contacting surface for cooperating with the first contacting surface to form an air-tight seal.

2. The EUV reticle pod of claim 1, wherein the trench continuously and completely surrounds the carrying surface, and the first contacting surface continuously and completely surrounds the trench.

3. The EUV reticle pod of claim 1, wherein the upper surface further comprises more than one basin communicating with the trench, and a bottom of the more than one basin is lower than the bottom of the trench.

4. The EUV reticle pod of claim 3, wherein a width of the more than one basin is larger than a width of the trench in a direction parallel to the carrying surface.

5. The EUV reticle pod of claim 1, wherein the cover comprises an indented surface between the concave and the second contacting surface, and the indented surface and the second contacting surface are situated on different horizontal levels, wherein a gap is kept between the indented surface and the upper surface of the base.

6. The EUV reticle pod of claim 1, wherein the cover comprises a plurality of guiding members that are configured to extend towards the base and to elastically contact the surrounding wall of the base when the cover is engaged with the base.

7. A EUV reticle pod comprising an outer box assembly and an inner box assembly, wherein the outer box assembly comprising an upper portion and a lower portion cooperating with each other and defining a containing space for the inner box assembly, and the inner box assembly comprising:
    a base having an upper surface and a surrounding wall, a plurality of positioning members being disposed on and protruded from the upper surface to define a receiving space for an EUV reticle, the surrounding wall surrounding and connecting to the upper surface, and the upper surface comprising:
        a carrying surface above which the EUV reticle is carried when the EUV reticle is received in the receiving space;
        at least one trench having a circular loop structure and a bottom of the trench is lower than the carrying surface; and
        a first contacting surface, wherein the carrying surface, the trench, and the first contacting surface are sequentially distributed from a center of the upper surface towards the surrounding wall; and
    a cover for engaging with the base and having a concave for accommodating the EUV reticle and a second contacting surface for cooperating with the first contacting surface to form an air-tight seal, wherein the upper surface comprises a plurality of the trenches which individually has the circular loop structure, and the trenches are situated between the carrying surface and the first contacting surface and each trench individually surrounds the positioning members.

8. A EUV reticle pod comprising an outer box assembly and an inner box assembly, wherein the outer box assembly comprising an upper portion and a lower portion cooperating with each other and defining a containing space for the inner box assembly, and the inner box assembly comprising:
- a base having an upper surface and a surrounding wall, a plurality of positioning members being disposed on and protruded from the upper surface to define a receiving space for an EUV reticle, the surrounding wall surrounding and connecting to the upper surface, and the upper surface comprising:
  - a carrying surface above which the EUV reticle is carried when the EUV reticle is received in the receiving space;
  - at least one trench having a circular loop structure and a bottom of the trench is lower than the carrying surface; and
  - a first contacting surface, wherein the carrying surface, the trench, and the first contacting surface are sequentially distributed from a center of the upper surface towards the surrounding wall; and
- a cover for engaging with the base and having a concave for accommodating the EUV reticle and a second contacting surface for cooperating with the first contacting surface to form an air-tight seal, wherein the cover comprises a plurality of elastic members that correspond to the locations of the positioning members, and the elastic members are configured to contact and press the EUV reticle when the cover is engaged with the base and the inner box assembly is contained in the outer box assembly.

9. A EUV reticle pod comprising an outer box assembly and an inner box assembly, wherein the outer box assembly comprising an upper portion and a lower portion cooperating with each other and defining a containing space for the inner box assembly, and the inner box assembly comprising:
- a base having an upper surface and a surrounding wall, a plurality of positioning members being disposed on and protruded from the upper surface to define a receiving space for an EUV reticle, the surrounding wall surrounding and connecting to the upper surface, and the upper surface comprising:
  - a carrying surface above which the EUV reticle is carried when the EUV reticle is received in the receiving space;
  - at least one trench having a circular loop structure and a bottom of the trench is lower than the carrying surface; and
  - a first contacting surface, wherein the carrying surface, the trench, and the first contacting surface are sequentially distributed from a center of the upper surface towards the surrounding wall; and
- a cover for engaging with the base and having a concave for accommodating the EUV reticle and a second contacting surface for cooperating with the first contacting surface to form an air-tight seal, wherein the base comprises a block member disposed in the trench, and a top end of the block member is brought into firm contact with the second contacting surface when the cover is engaged with the base.

* * * * *